US011061091B2

(12) United States Patent
Ozen et al.

(10) Patent No.: US 11,061,091 B2
(45) Date of Patent: Jul. 13, 2021

(54) METHOD FOR THE MAGNETIC RESONANCE EXAMINATION OF A MEASUREMENT OBJECT AND TO A RADIO-FREQUENCY UNIT OF A MAGNETIC RESONANCE IMAGING SCANNER

(71) Applicant: Albert-Ludwigs-Universitat Freiburg, Freiburg (DE)

(72) Inventors: Ali Caglar Ozen, Freiburg (DE); Michael Bock, Heidelberg (DE)

(73) Assignee: Albert-Ludwigs-Universität Freiburg, Freiburg (DE)

( * ) Notice: Subject to any disclaimer, the term of this patent is extended or adjusted under 35 U.S.C. 154(b) by 710 days.

(21) Appl. No.: 15/829,085

(22) Filed: Dec. 1, 2017

(65) Prior Publication Data

US 2018/0156878 A1 Jun. 7, 2018

(30) Foreign Application Priority Data

Dec. 2, 2016 (DE) .......................... 102016014340.1

(51) Int. Cl.
*G01R 33/36* (2006.01)
*G01R 33/561* (2006.01)
*G01R 33/46* (2006.01)
*G01R 33/48* (2006.01)

(52) U.S. Cl.
CPC ..... *G01R 33/3621* (2013.01); *G01R 33/4641* (2013.01); *G01R 33/4816* (2013.01); *G01R 33/561* (2013.01); *G01R 33/3657* (2013.01)

(58) Field of Classification Search
CPC ............ G01R 33/3621; G01R 33/3657; G01R 33/4641; G01R 33/4816; G01R 33/561
See application file for complete search history.

(56) References Cited

U.S. PATENT DOCUMENTS

2012/0223709 A1* 9/2012 Schillak ............. G01R 33/3621
324/309
2013/0271135 A1 10/2013 Ozen et al.

OTHER PUBLICATIONS

Salim, Maryam, et al. "Detection of mr signal during rf excitation using full-duplex radio system." Proc. Intl. Soc. Mag. Reson. Med. vol. 24. May 2016. (Year: 2016).*
Bharadia, Dinesh, Emily McMilin, and Sachin Katti. "Full duplex radios." Proceedings of the ACM SIGCOMM 2013 conference on SIGCOMM. 2013. (Year: 2013).*

(Continued)

*Primary Examiner* — Rishi R Patel
(74) *Attorney, Agent, or Firm* — Volpe Koenig

(57) ABSTRACT

A method for the magnetic resonance examination of a measurement object is described, in which a measurement sequence is used in which the magnetic resonance response to the transmitted signal during transmission is measured. It is provided that a correction signal corresponding to the transmitted signal be generated and be used for correction of the response signal. To this end, the correction signal is modulated by a phase value and an amplitude value. The phase value and the amplitude value are automatically and iteratively customized for optimum correction of the response signal by an optimization method using a respective present state value of the measurement signal. Further, a radio-frequency unit (1) is described that can be used to carry out the method according to the invention.

15 Claims, 9 Drawing Sheets

(56) References Cited

OTHER PUBLICATIONS

Özen, Ali Caglar, et al. "In vivo Concurrent Excitation and Acquisition MRI with Self-referenced Active Decoupling." Proc. Intl. Soc. Mag. Reson. Med. vol. 24. May 2016. (Year: 2016).*

Özen, Ali Caglar, et al. "Ensuring safety and functionality of electroglottography measurements during dynamic pulmonary MRI." Magnetic resonance in medicine 76.5 (Nov. 2015): 1629-1635. (Year: 2015).*

* cited by examiner

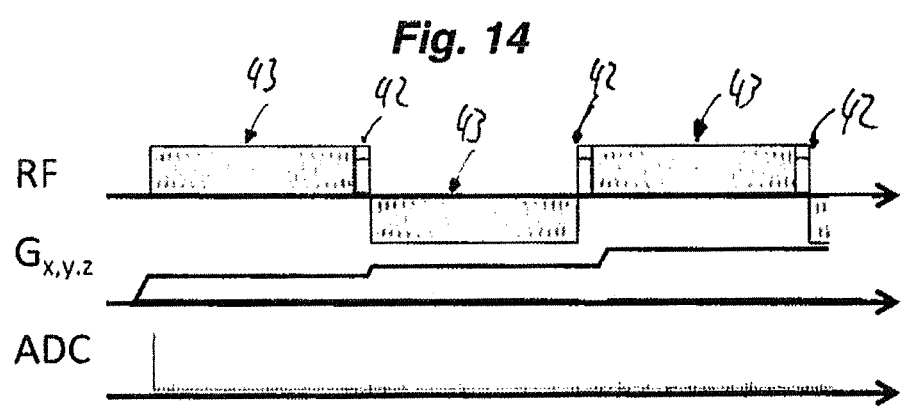

METHOD FOR THE MAGNETIC RESONANCE EXAMINATION OF A MEASUREMENT OBJECT AND TO A RADIO-FREQUENCY UNIT OF A MAGNETIC RESONANCE IMAGING SCANNER

INCORPORATION BY REFERENCE

The following documents are incorporated herein by reference as if fully set forth: German Patent Application No. 10 2016 014 340.1, filed Dec. 2, 2016.

BACKGROUND

The invention relates to a method for the magnetic resonance examination of a measurement object and to a radio-frequency (RF) unit of a magnetic resonance (MR) imaging scanner, such as an MRI scanner or NMR spectrometer, for example. The measurement object may be a patient, but also non-biological material, such as an oil field, for example.

Today, measurement sequences that preferably avoid picking up an MR signal while at the same time an MR signal is radiated into the measurement object are used almost exclusively.

The background to this division of signal transmission and signal reception that can usually be found is that it prevents the received signal from having a transmitted signal component that impairs the quality of said received signal.

Right from the early days of MR technology, it has been found that it is technologically extremely demanding to obtain a high-quality MR signal if data are picked up during signal generation. While the first measurements in MR scanning in the 1970s still used the "continuous wave method", rapidly pulsed measurement sequences have become established in MR scanning.

However, there is a need for measurement sequences that can be used in practice in which an MR signal is sent and an MR signal response is picked up at the same time. One type of such sequences is known as a CEA sequence, CEA being an acronym for "concurrent excitation and acquisition". At present, such measurement sequences frequently do not provide adequate quality, however.

One reason for the quality that is currently frequently inadequate is that a signal that is picked up during signal excitation inevitably has a transmitted signal component, since complete decoupling of the transmission and receiving coils is not possible. It is now a technological challenge to reduce this transmitted signal component in the received signal picked up as far as possible. A reduction of approximately 100 dB is beneficial, since the transmitted signal frequently has a signal intensity that is higher by this high value than the low signal intensity of the signal response emitted by the measurement object. Such high reduction values have not been achieved in MR technology to date.

Reductions of approximately 70 dB can be achieved using the methods known in MR technology to date, which can also be applied cumulatively, such as, in particular, geometric decoupling of the transmission and receiving coils or digital signal cancellation.

The invention relates to a method for the magnetic resonance examination of a measurement object that is already known from the prior art, in which a transmitted signal that usually defines an RF signal is radiated into the measurement object and a response signal emitted by the measurement object in reaction to the transmitted signal is picked up. In this case, the transmitted signal can be generated by an RF transmission coil and the response signal can be generated by an RF receiving coil. The RF receiving coil may also be identical to the RF transmission coil. To generate a magnetization within a measurement object, the measurement object can be introduced into a main magnetic field. Preferably, the main magnetic field is homogeneous and static in a measurement area. It can be generated by a preferably superconductive main magnet, for example, but may also be formed by a magnetic field of the earth or another magnetic field.

According to the invention, there is further provision for the response signal to be at least intermittently picked up during a period of radiation of the transmitted signal. This can be accomplished by using particularly a CEA sequence, which has already been described above, but also any other measurement sequence known to or able to be developed by a person skilled in the art that has the described property. According to the invention, a measurement signal is generated by correction of the response signal. This is also fundamentally known. As such, the method of digital signal cancellation already described above, for example, can be used in order to improve the quality of the response signal picked up. From the measurement signal, a piece of information about the measurement object is then reconstructed according to the invention. The information about the measurement object may particularly be a magnetic resonance spectrum and/or a magnetic resonance image.

To carry out a method for MR examination of a measurement object, a radio-frequency unit is known having a generator for generating a radio-frequency signal, a signal divider that is operatively connected to an output of the generator and that has a first output and a second output, a transmission coil that can be used to generate a transmitted signal and that is operatively connected to the first output of the signal divider, a receiving coil that can be used to pick up a response signal forming a magnetic resonance signal from a measurement object, a modulator that is operatively connected to the second output of the signal divider, the modulator comprising a phase modulator and/or an amplitude modulator, and a signal combiner that is operatively connected to the receiving coil and the modulator and can be used to generate a measurement signal. The signal combiner may be a power coupler, for example.

A method and a radio-frequency unit of the type described above are known, but particularly have the disadvantages described above.

US 2013/0271135 A1 discloses a method for acquiring magnetic resonance data in which a transmit array is operated during the data acquisition, this meaning that the transmit array is electromagnetically decoupled from at least one receiving coil while the magnetic resonance sequence is carried out.

SUMMARY

The invention is based on the object of providing a method for the magnetic examination of a measurement object and a radio-frequency unit of an MRI scanner, so that high-quality information about the measurement object can be provided.

This object is achieved using one or more features of the invention. In particular, the invention therefore provides, for a method of the type described above, that a correction signal corresponding to the transmitted signal is generated. There is a correspondence, for example, when the information content of the correction signal and of the transmitted signal match or when the signals can be converted into one another. This is the case particularly when the transmitted signal and the correction signal differ merely in an amplitude and/or phase and/or frequency. Corresponding signals can be generated, by way of example, when an RF signal generated by an RF generator is split in a power divider into a transmit signal transmitted to a transmission coil and a correction signal having a modulated signal amplitude in comparison with the transmit signal.

According to the invention, the correction signal is used for correction of the response signal. The correction can be made particularly by a phase modulator and/or an amplitude modulator.

According to the invention, the response signal is corrected by virtue of the following steps being automatically carried out iteratively:

In a first step, a present state value of the measurement signal is ascertained.

In a second step, a present phase value and/or a present amplitude value for the correction signal is ascertained. To this end, an optimization method is used, the optimization method using the present state value of the measurement signal as input.

In a third step, a present section of the correction signal corresponding to a present section of the transmitted signal is modulated with the present phase value and/or the present amplitude value. The present section of the transmitted signal and of the corresponding correction signal may each be a signal of a particular duration. By way of example, a signal pulse of a particular duration is considered.

In a fourth step, a present section of the measurement signal is generated by subtraction of the present section of the correction signal from a present section of the response signal that is picked up at the same time as the present section of the transmitted signal is radiated. The subtraction can be effected by a signal combiner, for example.

The iterative correction automatically taking place that has just been described has the great advantage that it allows effective rejection of an interfering transmitted signal component in the measurement signal. Particularly combination of this correction method with already known methods allows a signal rejection of up to 100 dB or even beyond to be achieved as a result. This provides an MR examination method that can be used to provide high-quality measurement data.

As a result, an MR examination can be performed by un-pulsed measurement sequences. This allows a series of new applications having outstanding properties. By way of example, un-pulsed sequences are quiet, they can be used to increase an acquisition efficiency up to 100%, and measurements of MR signals for measurement objects with ultra-short T2 times are made possible.

To perform the method, there may be provision for the steps just described to be performed at least once, but normally repeatedly, during an MR examination. Further, there may be provision for initialization to be effected before the steps just described are carried out.

In an advantageous refinement of the method, there may be provision for the state value of the measurement signal to be a measure of a transmitted signal component in the measurement signal. This may be advantageous, since it is especially an aim of the correction to reduce a transmitted signal component in the measurement signal. It is therefore expedient to introduce a measure thereof into the optimization method. Alternatively or additionally, there may be provision for the state value of the measurement signal to be a measure of a signal strength of the measurement signal.

The measure may be formed by a p2 standard of a section of the measurement signal, for example. This is easy to implement, since the analog measurement signal or data points of the measurement signal are usually easily accessible in digitized form. The section of the measurement signal used can be particularly a previously, preferably most recently, generated section of the measurement signal. The use of a measure of the signal strength of the measurement signal has the advantage that the signal strength is immediately available. It can frequently also form a measure of a transmitted signal component in the measurement signal at the same time, since this component regularly determines the signal intensity to a much greater extent than the signal that is actually of interest that is emitted by the measurement object.

In a further advantageous refinement of the method, there may be provision for the optimization method to use at least one further previously, in particular most recently, ascertained state value of the measurement signal as input. Of particular interest in this case are the most recently ascertained state value or the most recently ascertained state values. The inclusion of further information can be utilized in order to improve the correction of the response signal.

It may be advantageous if, alternatively or additionally, the respective present phase value and/or the respective present amplitude value is ascertained by a gradient method.

In this case, it should be borne in mind that a target functional to be minimized for the gradient method is regularly not known a priori, but can be measured on a point-by-point basis and therefore estimated. As such, the state value can be chosen as the target functional to be minimized, for example. A slope of the target functional can be estimated numerically by using information about one or more already previously ascertained state values of the measurement signal.

To perform a fast, effective and practicable gradient method, there may be provision, by way of example, for every iteration to involve a variable on which the phase value and/or the amplitude value is dependent being altered. The variable may be the phase value and/or the amplitude value itself, but also a voltage, for example. As such, it is possible for a modulator to be supplied with the voltage, for example, the modulator being able to implement a phase modulation of the correction signal with the phase value and/or an amplitude modulation of the correction signal with the amplitude value electronically. In addition, the gradient method may have provision for the direction in which the variable has been altered in a previous iteration to be read, for a step size additionally to be chosen for an alteration of the variable, for the present state value of the measurement signal additionally to be compared with a or the previously ascertained state value and for the variable to be altered in the read direction in the event of an improvement in the state value and for the variable to be altered in the direction opposite to the read direction in the event of a worsening of the state value. For the choice of the step size, it may be expedient if the step size is chosen to fall monotonously from iteration to iteration.

To achieve the best possible correction with as few iterations as possible, there may also be provision for the optimization method to involve an optimum phase value being ascertained in a first step before an optimum amplitude value is ascertained in a second step. Optimization can also be effectively alternately.

In order to attain the highest possible acquisition efficiency, a further advantageous refinement of the method may have provision for the response signal to be picked up completely during the period of radiation of the transmitted signal. Alternatively or additionally, there may be provision for a CEA sequence to be used. Alternatively or additionally, there may be provision for the information about the measurement object to be reconstructed from the measurement signal by virtue of at least 90%, preferably 100%, of a total pickup time of the measurement signal being used.

In a further advantageous refinement of the method, there may be provision for the modulating of the present section of the correction signal that corresponds to the present section of the transmitted signal with the present phase value and/or the present amplitude value to be effected in voltage-controlled fashion. This can have the advantage that it allows effective electronic and automatic implementation of the correction. It may be advantageous if this is effected using a phase modulator adjustable under voltage control, preferably operated in analog fashion, and/or an amplitude modulator adjustable under voltage control, preferably operated in analog fashion. It may be particularly advantageous if, in a region traversed during the MR examination, a phase/voltage characteristic of the phase modulator and/or an amplitude/voltage characteristic and/or an attenuation/voltage characteristic of the amplitude modulator is monotonous or strictly monotonous or even linear. The profile of the characteristics may be rising or falling. Linearity may be advantageous. It is possible to compensate for a nonlinearity during the optimization by using variable step sizes. Alternatively or additionally, there may be provision for voltage control to be effected digitally. Digital control has the advantage that an optimization method can be performed by a PC or a microprocessor, the optimization method being able to deliver digital control data, such as voltage values, for example, as output data.

In a further advantageous refinement of the method, there may be provision for the present section of the correction signal to be subtracted from the present section of the response signal that is picked up at the same time as the present section of the transmitted signal is radiated by virtue of a signal combiner, preferably a power coupler, being used. The signal combiner can be used to combine signals with one another. The signal combiner is therefore optimally suited to the subtraction of signals.

In a further advantageous refinement of the method, there may be provision for the measurement signal to be amplified using a signal amplifier, the signal amplifier having a dynamic bandwidth that is outside a signal strength of the amplitude-modulated correction signal. It is particularly advantageous if the signal strength of the correction signal and/or of the response signal exceeds the dynamic bandwidth of the amplifier. It can also be stated that the signal strength of the correction signal and/or of the response signal is at least so high that the amplifier is saturated. Even if this appears disadvantageous at first glance, since the amplifier in this case is not capable of processing an insufficiently corrected measurement signal, at the same time it produces the advantage, however, that an amplifier with a small dynamic bandwidth can be used, which means that the respective device is inexpensive and/or has a high Q factor.

Particularly good signal correction is possible in a further advantageous refinement of the method in which there is further provision for first the state value of the measurement signal to be checked and for, in the event of a first limit value being exceeded, the steps that are to be performed for correction of the response signal to be carried out until the state value of the measurement signal has reached a second limit value. The check on the initially checked state value of the measurement signal can be effected once, regularly repeatedly, particularly at regular intervals of time, during an MR measurement and/or MR examination. The two limit values may be different or else identical. It may be particularly advantageous if the first and/or the second limit value is larger than an estimate for a maximum state value of the measurement signal. The limit value can exceed the estimate by at least 0%, 10%, 50% or at least 100%, for example. Such an estimate can arise from theoretical considerations or else be based on a measurement, for example using a sequence section in which a maximum state value can be expected.

It may be particularly advantageous in this case if the maximum state value of the measurement signal is a value at which the measurement signal does not have a transmitter signal component. If the maximum state value is a signal strength, then said maximum state value can be ascertained by first of all performing a measurement without a measurement object and then a measurement with a measurement object. From the difference between corresponding signal sections from the two measurements, it is then possible to ascertain an estimate for the maximum state value. Alternatively, an off-resonant transmitted pulse can also be radiated into the measurement object, for example, which transmitted pulse does not substantially excite the spins, but delivers undesirable coupling-in of the transmitted pulse in the receiving coil. Knowledge of the frequency dependency of the transmitted signal component in the measurement signal can then be used to obtain an estimate for the maximum state value by extrapolation onto suitable, in particular on-resonant, frequencies. This may be necessary, since frequently the receiving coil reacts differently for an off-resonance than for an on-resonance, so that the on-resonant response can still be inferred. This can be effected before the actual measurement by calibration, for example.

In order to retain a maximum acquisition efficiency, a further advantageous refinement of the method may have provision for the respective present section of the measurement signal also to be used for reconstruction of the information about the measurement object. In this case, the use of the method steps for correction of the response signal requires no additional time.

Alternatively, there may be provision for the respective present section of the measurement signal not to be used for reconstruction of the information about the measurement object. Although this means that additional time windows are potentially needed for the correction of the response signal when an MR measurement is carried out, this method can involve checking and ensuring that every measurement section picked up also has a quality that meets the respective requirements. It may be advantageous if the respective present section of the measurement signal has a duration that corresponds to a pulse duration of a transmitted signal that is radiated into the measurement object in order to generate a section of a measurement signal that is used for reconstruction. Such a correction can advantageously be integrated into a measurement sequence. In order to reduce the measurement time, however, it may also be advantageous to restrict the duration of the present section of the measurement signal to a fraction, such as one fifth, tenth or twentieth, of the aforementioned pulse duration.

In order to increase the quality of the reconstructed information about the measurement object, a further refinement of the method may have provision for, in the event of the present state value of the measurement signal exceeding a third limit value, the most recently generated section of the measurement signal to be generated again. In this case, there may be provision for this to be effected at the next possible time after the third limit value is exceeded or else at a later time in the MR examination. In this case, the third limit value can particularly match the first and/or the second limit value.

In a further advantageous refinement of the method, there may be provision for an on-resonant pulse to be radiated into the measurement object in order to generate the present section of the measurement signal. The on-resonant pulse may preferably be a square-wave pulse. An advantage of the application of an on-resonant pulse is that this requires no a priori knowledge about the size of the transmitted signal component of the response signal. This may be different if, by way of example, a sweep transmitted pulse used for the generation of measurement data provided for the reconstruction is also meant to be used for correction of the response signal, since an off-resonant transmitted pulse of this kind would require the often frequency-dependent correction for each off-resonant frequency to be regularly taken into consideration individually.

The cited object is achieved according to the invention by virtue of the features of the coordinate claim directed at a radio-frequency unit having been provided. In particular, the cited object is therefore achieved according to the invention by providing, for a radio-frequency unit of the type described above, that a control unit is configured that is operatively connected to the signal combiner and the modulator and that the radio-frequency unit can be used to carry out the method according to the invention and also the refinements of the method that are described above. The control unit may for example be a computation unit, particularly a PC. A radio-frequency unit configured in this manner can be used for an MR examination to obtain high-quality information about a measurement object.

BRIEF DESCRIPTION OF THE DRAWINGS

The invention is now described in more detail using a few exemplary embodiments, but is not restricted to these few exemplary embodiments. Further exemplary embodiments arise through combination of the features of single or multiple protective claims with one another and/or with single or multiple features of the exemplary embodiments.

In the drawings:

FIG. 14 shows an alternative sequence diagram for an MR examination according to the invention.

DETAILED DESCRIPTION OF THE PREFERRED EMBODIMENTS

Figure 1:
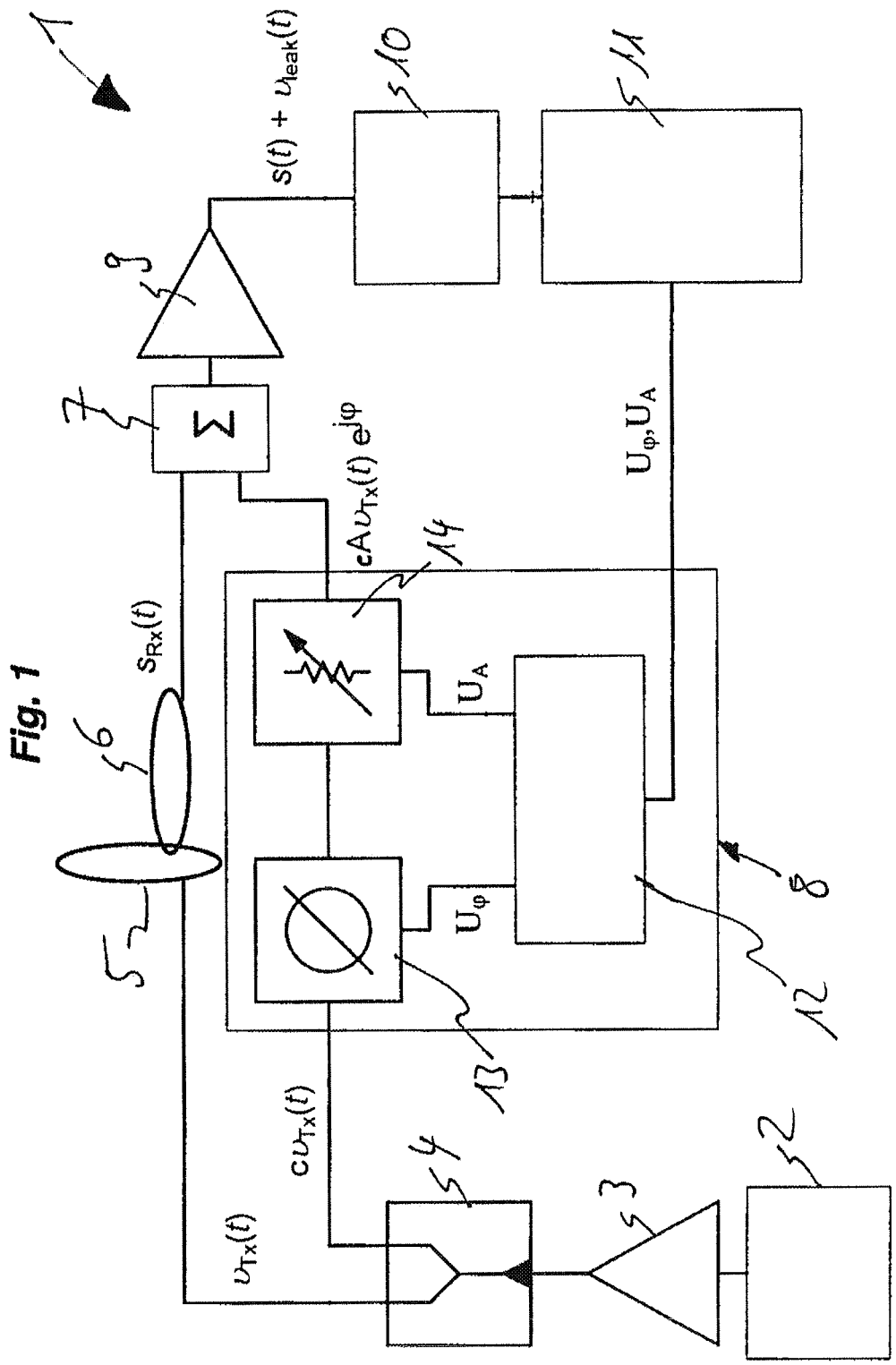
FIG. 1 shows an inventive radio-frequency unit of a magnetic resonance imaging scanner.

In the description of different exemplary embodiments of the invention that follows, elements with a matching function are provided with matching reference numerals even if their design or shape is different.

FIG. 1 shows an inventive radio-frequency unit 1 of a magnetic resonance imaging scanner that is not depicted, which radio-frequency unit can be used to carry out a method according to the invention. An RF generator 2 that can be used to generate an RF signal is connected to a low-noise signal amplifier 3 (low noise amplifier) that transmits the amplified RF signal to the signal divider 4. In the signal divider 4, the RF signal is split into a transmit signal $v_{Tx}(t)$, which is transmitted to the transmission coil 5, and a corresponding correction signal $c^*v_{Tx}(t)$. The correction signal has the same signal profile as the transmit signal, but has its amplitude modulated with the factor c, for example with c=0.28.

The transmit signal is converted by the transmission coil 5, so that a transmitted signal can be radiated into a measurement object (not depicted). The receiving coil 6 can then be used to pick up an MR signal emitted by the measurement object in reaction to the transmitted signal. A response signal $s_{Rx}(t)$ picked up using the receiving coil 6 is then transmitted to the signal combiner 7. In the signal combiner 7, the correction signal $A^*c^*v_{Tx}(t)^*e^{j\varphi}$ modulated by the modulator 8 is subtracted from the response signal. The subtracted signal is then amplified by the ultra-low-noise signal amplifier 9 (ultra low noise amplifier). The resultant measurement signal $s(t)+v_{leak}(t)$ is transmitted to an analog-to-digital converter 10 that digitizes the measurement signal.

The digitized measurement signal is then transmitted to a computation unit 11. In the exemplary embodiment described here, the computation unit 11 is an external personal computer (PC). The computations to be performed by the computation unit 11 can also be performed by a reconstruction unit, for example, however, which also performs the reconstruction of the desired information about the measurement object from the digitized measurement signal, such as particularly an image reconstruction.

The computation unit 11 sends the computation result $U_\varphi, U_A$ to the modulator 8. The variables $U_\varphi, U_A$ are voltage values in digital form that can be provided by the DC voltage power supply module 12. The DC voltage power supply module 12 supplies a phase modulator 13 operated in analog fashion with the voltage $U_\varphi$ and supplies the amplitude modulator 14, which is likewise operated in analog fashion, with the voltage $U_A$. The phase modulator supplied with the voltage $U_\varphi$ impresses a phase $\varphi$ onto the correction signal $c*v_{Tx}(t)$, and the amplitude modulator supplied with the voltage $U_A$ modulates the phase-shifted correction signal with the amplitude A, so that ultimately the modulator 8 delivers the modulated correction signal $A*c*v_{Tx}(t)*e^{j\varphi}$ to the signal combiner 7 already described above.

Figure 2:
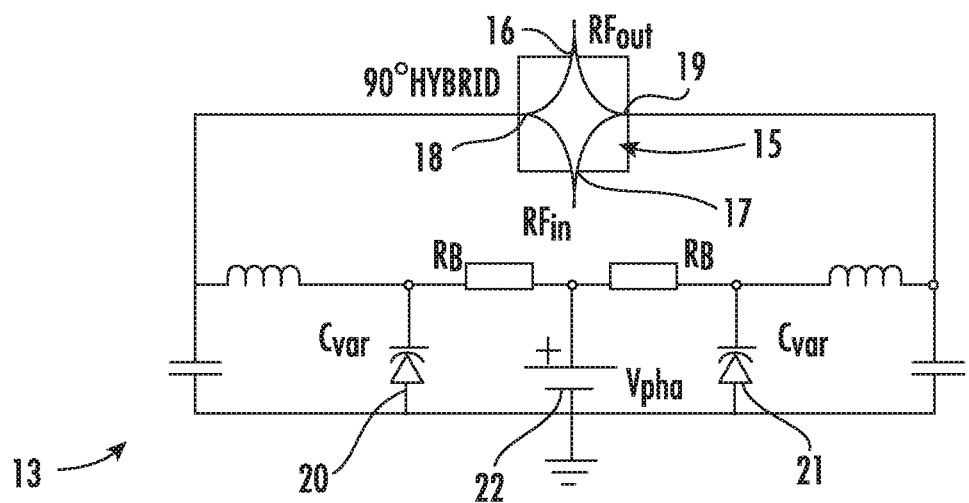
FIG. 2 shows a simplified circuit diagram of a phase modulator that can be used in FIG. 1.

FIG. 2 shows a simplified circuit diagram of a voltage-controlled phase modulator 13 that can be used in FIG. 1. The phase modulator 13 is an analog phase shifter of reflection type. It can be used to impress a variable phase $\varphi$ onto an input signal "$RF_{in}$" applied to a first connection 16 of a 90° hybrid coupler 15, so that the output signal "$RF_{out}$" at a second connection 17 has a phase shift of $\varphi$ in relation to the input signal. To achieve this, the impedances at a third connection 18 and at a fourth connection 19 of the 90° hybrid coupler are varied. This is effected by using varactor diodes 20, 21, whose respective capacitance $C_{Var}$ is adjustable by virtue of the phase $V_{pha}$ of a DC voltage source 22 being altered, for example by the DC voltage power supply module 12. In the exemplary embodiment described here, $C_{Var}$ is monotonously rising relative to the voltage $V_{pha}$. At 25 V, $C_{Var}$ may be 75 pF, for example.

Figure 3:
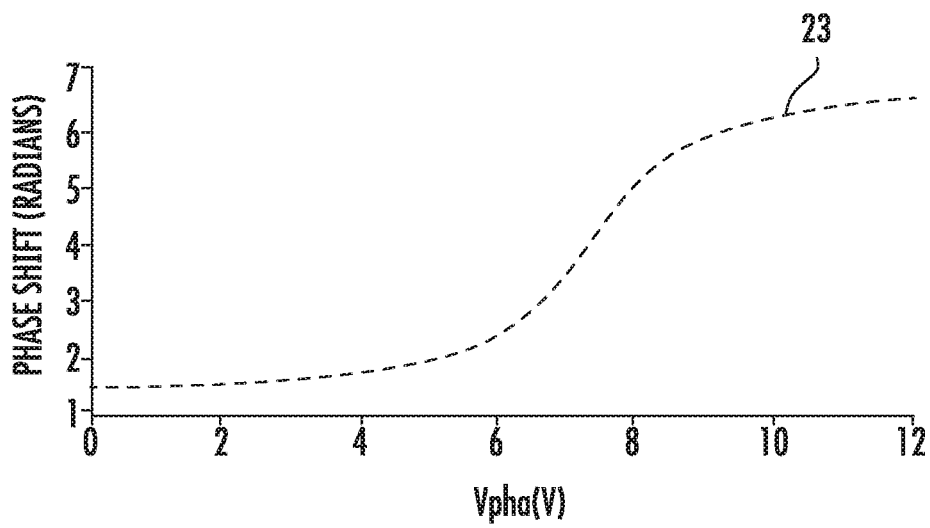
FIG. 3 shows a profile of the modulating phase value as a function of an input voltage of the phase modulator shown in FIG. 2.

FIG. 3 shows the phase shift attained with the phase modulator 13 depicted in FIG. 2 as a function of the control voltage $V_{pha}$. The phase/voltage characteristic 23 shown in FIG. 3 may be important if, although specifically a particular phase shift is meant to be attained, merely voltage values $V_{pha}$ are prescribable.

Figure 4:
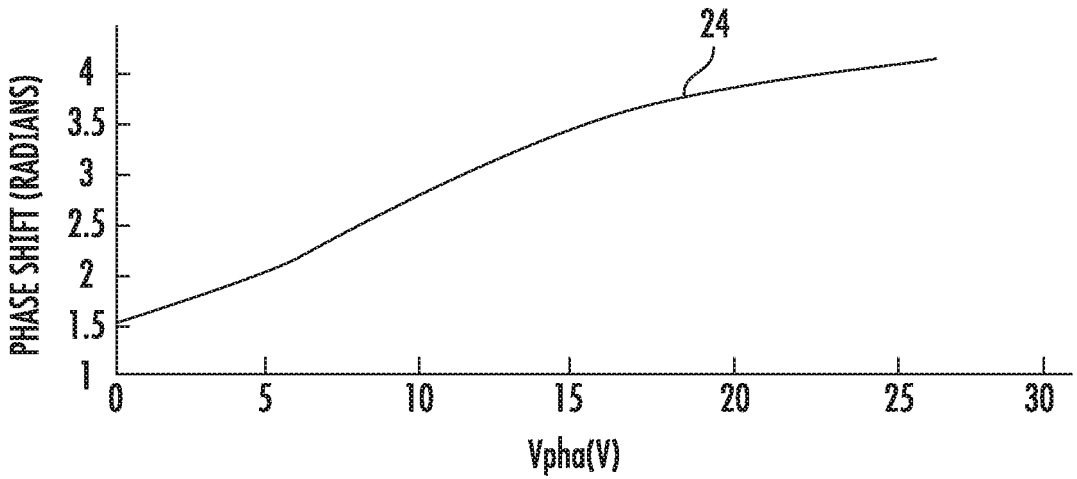
FIG. 4 shows a profile of the modulating phase value as a function of an input voltage of an alternative phase modulator.

FIG. 4 shows the phase/voltage characteristic 24 of an alternative phase modulator 13 that can be used in FIG. 1. The phase/voltage characteristic 24, like the phase voltage characteristic 23 described above, is strictly monotonously rising and, furthermore, has an almost linear profile. The alternative phase modulator 13 therefore reacts less sensitively to voltage changes than the phase modulator 13 shown in FIG. 2.

Figure 5:
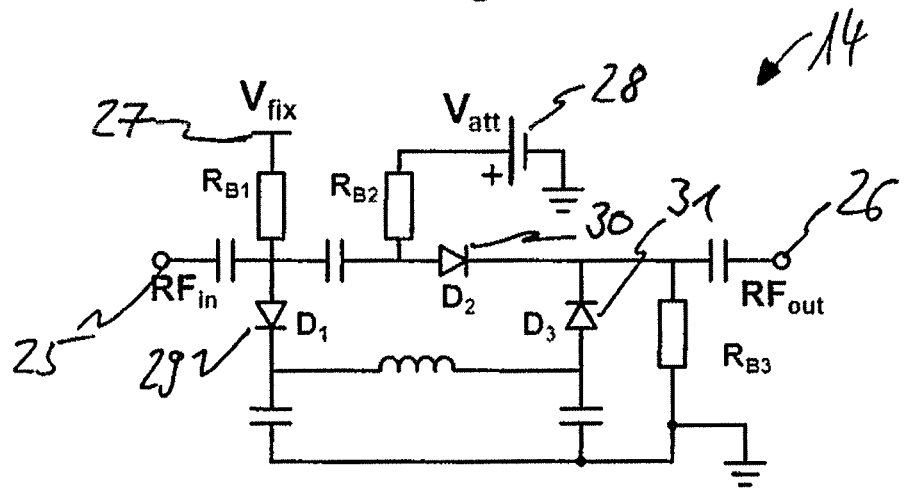
FIG. 5 shows a simplified circuit diagram of an amplitude modulator that can be used in FIG. 1.

FIG. 5 shows a simplified circuit diagram of an amplitude modulator 14 that can be used in FIG. 1. In the case of the amplitude modulator 14 shown in FIG. 5, the signal leaning from a second connection 26 is attenuated in comparison with a signal arriving at a first connection 25. The degree of attenuation is adjustable by a DC voltage source 27 with invariable voltage $V_{fix}$ and a DC voltage source 28 with variable voltage $V_{att}$. To use the amplitude modulator 14 shown in FIG. 5 in the RF unit shown in FIG. 1, $V_{fix}$ can be set to 4.5 V, for example, and $V_{att}$ can be varied between 0 V and 8 V, for example. The voltage-controlled amplitude modulator 14 is based on a π network that is formed by the three pin diodes 29, 30 and 31. The pin diodes 29, 30 and 31 behave as voltage-controlled resistors. If $V_{att}$ is raised, the resistance in the RF path between the first connection 25 and the second connection 26 decreases.

Figure 6:
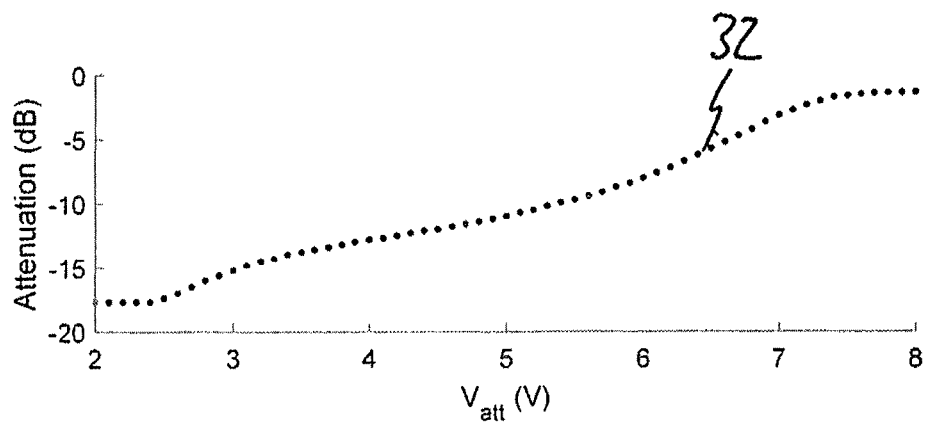
FIG. 6 shows a profile of the modulating amplitude value as a function of an input voltage of the amplitude modulator shown in FIG. 5.

FIG. 6 shows an attenuation/voltage characteristic 32 that corresponds to the amplitude modulator 14 shown in FIG. 5. The y axis plots the attenuation in dB, and the x axis plots the set voltage $V_{att}$ in volts. As can be seen from FIG. 6, the attenuation/voltage characteristic 32 has a monotonously rising profile, is strictly monotonous between $V_{att}$=2.5 V and $V_{att}$=°8.0° V and, in this range, has an almost linear dependency of the attenuation on the voltage $V_{att}$.

Figure 7:
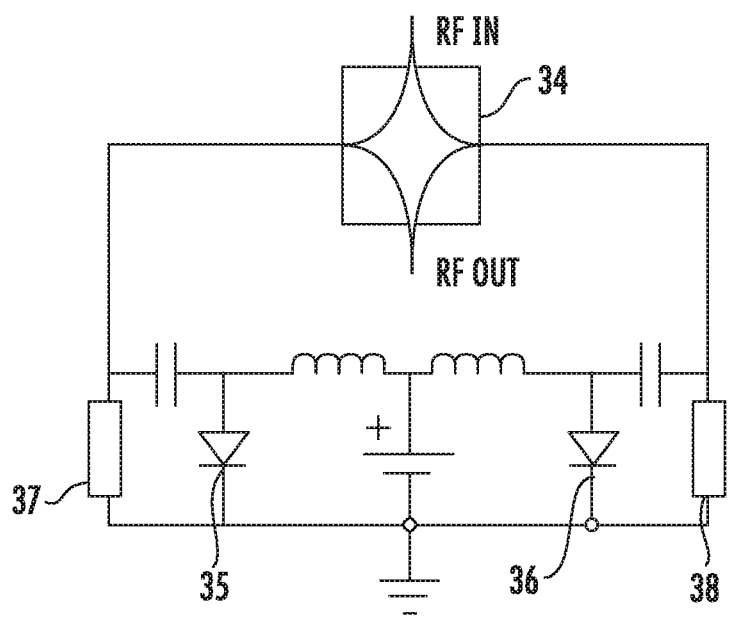
FIG. 7 shows a simplified circuit diagram of an alternative amplitude modulator that can be used in FIG. 1.
Figure 8:
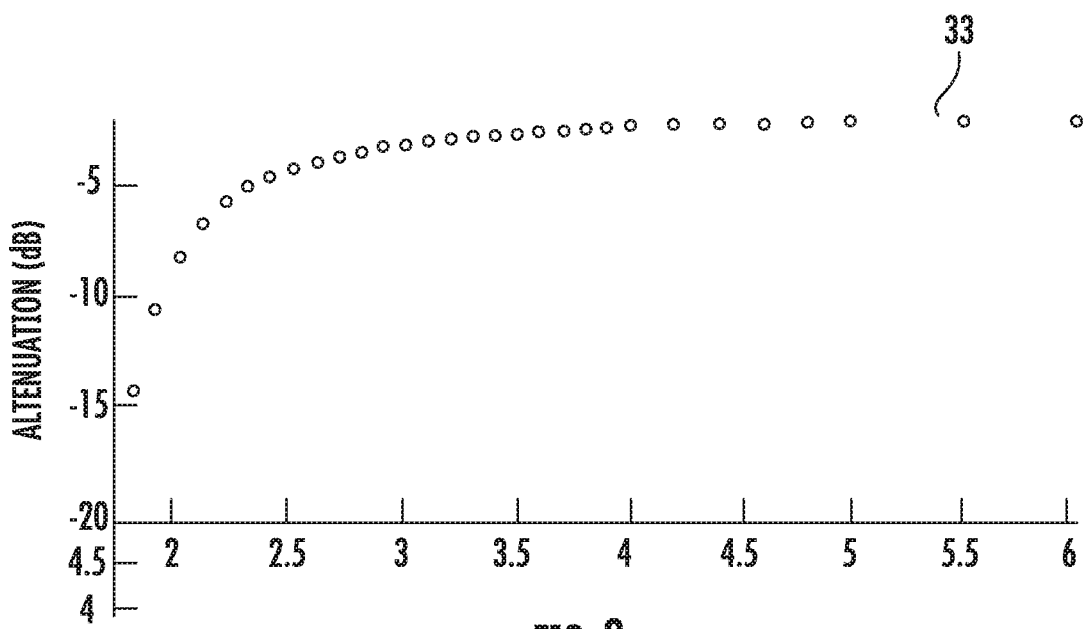
FIG. 8 shows a profile of the modulating amplitude value as a function of an input voltage of the amplitude modulator shown in FIG. 7.

FIG. 7 shows a simplified circuit diagram of an alternative amplitude modulator 14 that can be used in FIG. 1. FIG. 8 shows the corresponding strictly monotonously rising attenuation/voltage characteristic 33. The alternative amplitude modulator 14 shown in FIG. 7 is an attenuator with a hybrid coupler 34 that has a symmetrical configuration. The amplitude modulator 14 is matched, so that reflections are prevented and the analog correction circuit has a wider useful bandwidth than the amplitude modulator 14 shown in FIG. 5. Pin diodes 35, 36 have been connected up in parallel with 50Ω resistors 37, 38. This configuration already provides adequate attenuation and is less sensitive to voltage changes than the amplitude modulator 14 depicted in FIG. 5 in a detail from a usable attenuation range.

Figure 9:
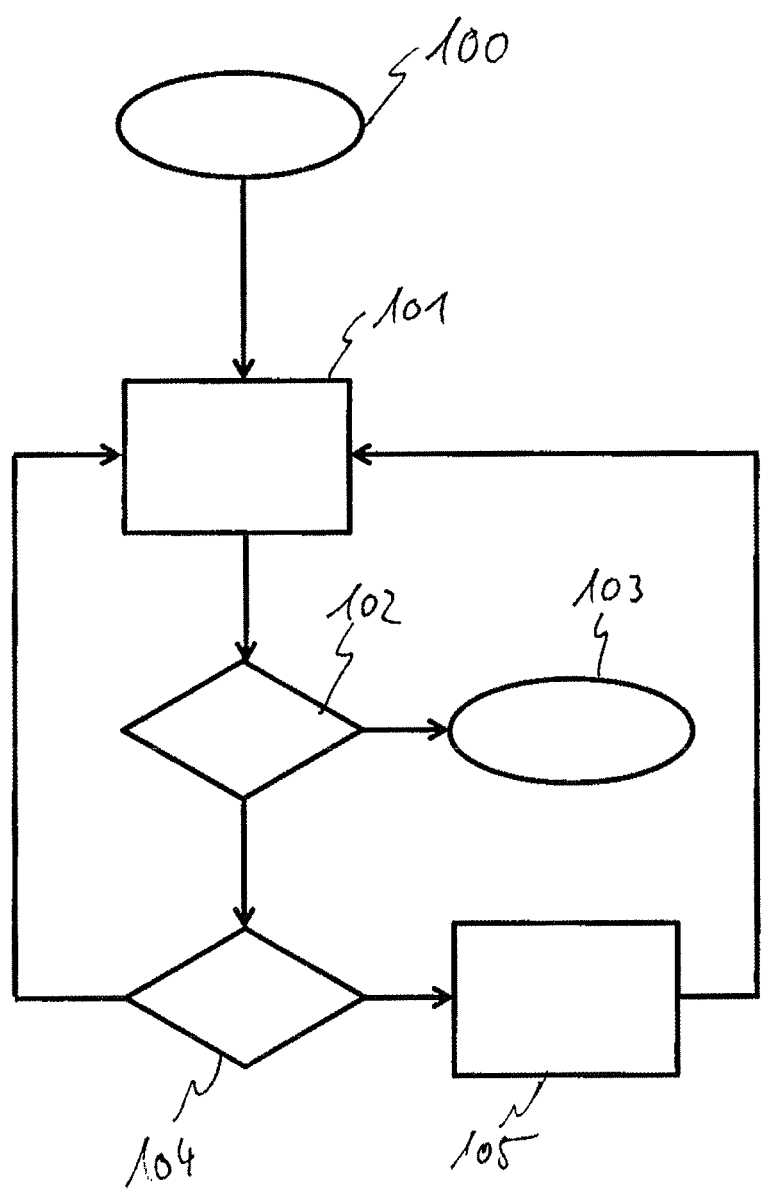
FIG. 9 shows a flowchart for a method according to the invention for the MR examination of a measurement object.

FIG. 9 shows an exemplary embodiment of an inventive method for the MR examination of a measurement object in the form of a flowchart. The method can be carried out using the RF unit 1 shown in FIG. 1. A sequence diagram from an MR measurement for which the method depicted in FIG. 9 can be used is depicted in FIG. 10.

First, initialization of the method takes place in step 100. In this step, initial values are determined for the voltages $U_\varphi$ and $U_A$ that are intended to be used to operate the phase modulator 13 and the amplitude modulator 14 at the beginning of the measurement. These values may be stored in a memory or else determined by a prior measurement. In this context, it is made certain that the ultra-low-noise signal amplifier 9 connected downstream of the signal combiner 7 is not saturated. Further, initial values are stipulated for the optimization method. In particular, initial step sizes are stipulated, i.e. the voltage values $\Delta U_\varphi$ and $\Delta U_A$ in the exemplary embodiment described here. These voltage values prescribe that, after the first iteration of the optimization method, $U_\varphi$ is changed by $\Delta U_\varphi$ and $U_A$ is changed by $\Delta U_A$. Further, it is possible to stipulate whether the initial change is intended to be effected in a positive or a negative direction, i.e. whether $U_{\varphi,A} \to U_{\varphi,A} + \Delta U_{\varphi,A}$ or whether $U_{\varphi,A} \to U_{\varphi,A} - \Delta U_{\varphi,A}$. These initial values may also be prescribed or can be determined by a prior measurement.

Figure 10:
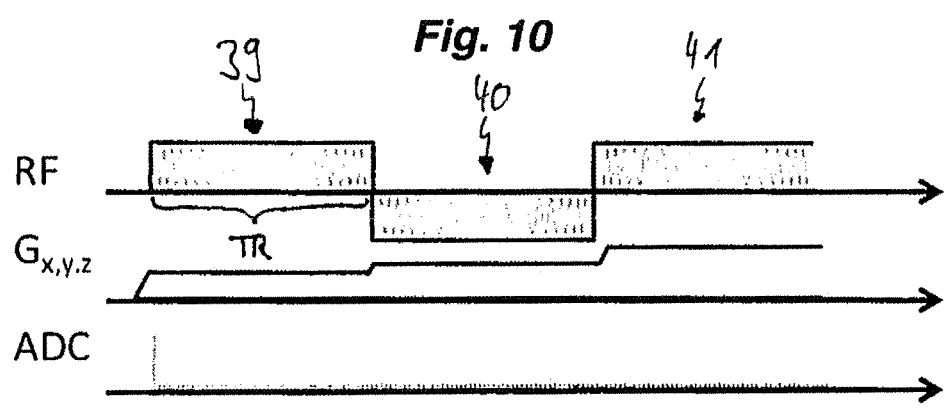
FIG. 10 shows a sequence diagram from an MR measurement in which the method depicted in FIG. 9 can be used.

After the initialization 100, a first section 39 of the measurement selected by the user and known to a person skilled in the art is then performed with a duration of TR in a step 101 (cf. FIG. 10). To this end, a transmitted signal of duration TR is radiated into the measurement object and picked up using the receiving coil 6 by applying particular gradient sizes $G_{x,y,z}$ that can be ascertained by a person skilled in the art. As already described above, the correction signal modulated with $\varphi$ and A is subtracted from the response signal picked up, is amplified and is digitized. The measurement data ascertained in this manner are transmitted to a reconstruction unit for buffer-storage and later use for the reconstruction of the desired information about the measurement object. The same measurement data are also transmitted to the computation unit 11.

In a subsequent step 102, a check is performed to determine whether the measurement is at an end. This is the case when the measurement sequence provides no further measurement sections 39, 40, 41. In this case, the method is terminated in step 103. To this end, the information that the user requires about the measurement object, such as particularly an MR image, is reconstructed particularly from the data supplied to the reconstruction unit.

If the measurement is not at an end, the computation unit 11 then carries out step 104. In this step 104, a check is performed to determine whether the signal strength of that section of the measurement signal 39, 40, 41 that is ascertained in step 101 exceeds a limit value that is stipulated in step 100. In this case, the limit value can be determined as already described above, for example by virtue of a respective measurement with a measurement object and without a measurement object being performed and a difference for the respective measurement result being formed and a supplement of 50%, for example, being added to this difference. The signal strength of the measurement section 39, 40, 41 is ascertained by virtue of the p2 standard of the measurement data of the measurement section that are available in digital form and conditioned as a vector being computed.

If the limit value is not exceeded by 50%, it is assumed that the present values of φ and A that are used for correction are sufficiently optimum and the measurement is continued in step 101 by virtue of the subsequent measurement step 40, 41 being performed.

As soon as and whenever, in the course of the measurement, the limit value is exceeded by at least 50%, however, the optimization step 105 is carried out prior to the start of the next measurement section 40, 41. In this step 105, new values $U_\varphi$ and $U_A$ are first of all determined via the computation unit 11. To this end, the signal intensity of the present measurement section 39, 40, 41 is first of all compared with the signal intensity of the most recently picked up measurement section 39, 40, 41. Should the signal intensity have decreased, it is assumed that the most recently performed adaptation of the values $U_\varphi$ and $U_A$ has led to an improvement in the quality of the measurement signal, so that the present values of $U_\varphi$ and $U_A$ can also be increased in the present iteration step if an increase has taken place previously and can be decreased if a decrease has taken place previously. In the event of a worsening, voltage values are adapted in the opposite direction. In the exemplary embodiment described here, the voltage values $U_\varphi$ and $U_A$ are adapted using the constant, initial step sizes $\Delta U_\varphi$ and $\Delta U_A$. In an alternative exemplary embodiment, $\Delta U_\varphi$ and $\Delta U_A$ are not constant and are readapted according to a particular specification in each iteration. By way of example, it may be expedient if the sizes of $\Delta U_\varphi$ and $\Delta U_A$ are dependent on the extent to which the limit value is exceeded. If it is exceeded to a small extent, then $\Delta U_\varphi$ and $\Delta U_A$ can be chosen to be smaller than if it is exceeded to a great extent, for example.

After the new values $U_\varphi$ and $U_A$ are computed, these values are transmitted to the DC voltage power supply module 12.

The measurement is then continued in step 101 by virtue of the subsequent measurement section 40, 41 being formed with values for φ and A that are adapted according to the respective phase/voltage characteristic 23, 24 and attenuation/voltage characteristic 32, 33, respectively.

Figure 11:
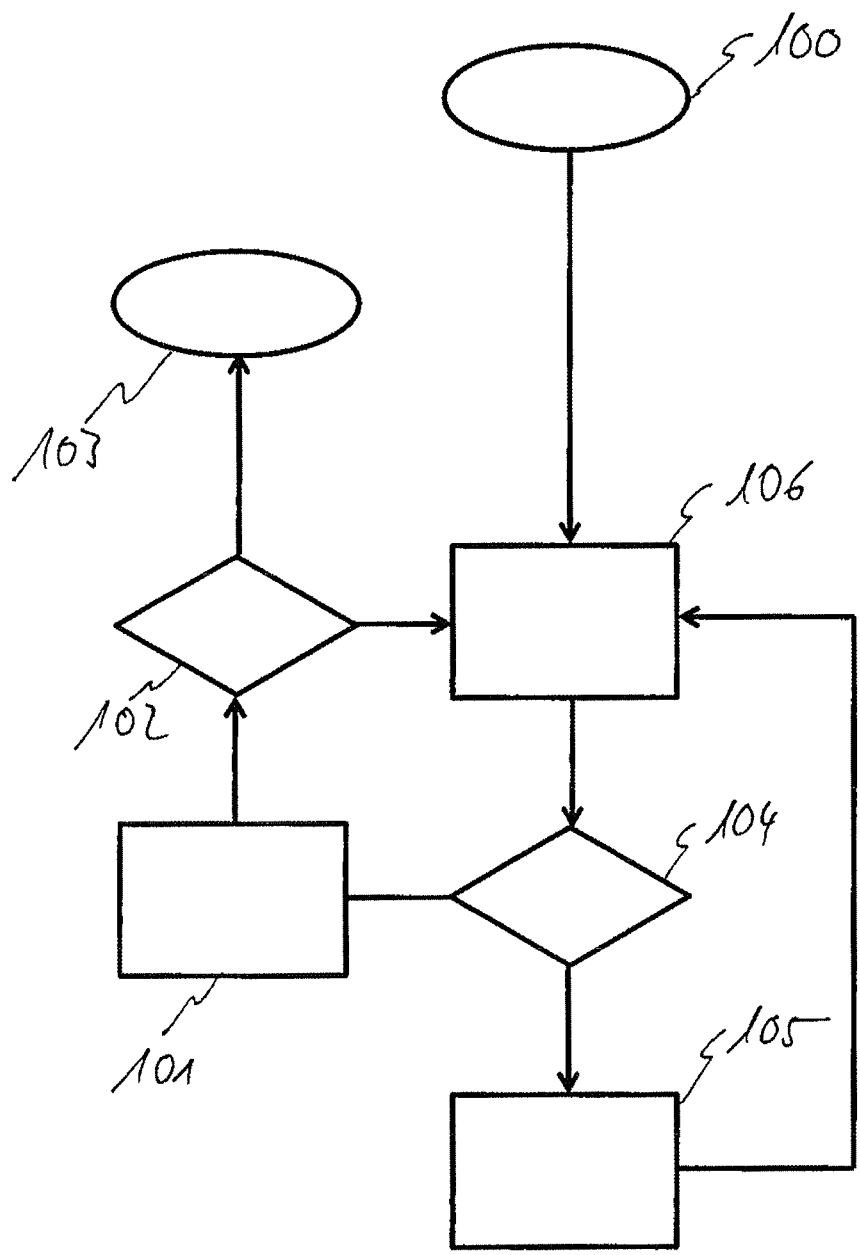
FIG. 11 shows a flowchart for an alternative method according to the invention for the MR examination of a measurement object.
Figure 12:
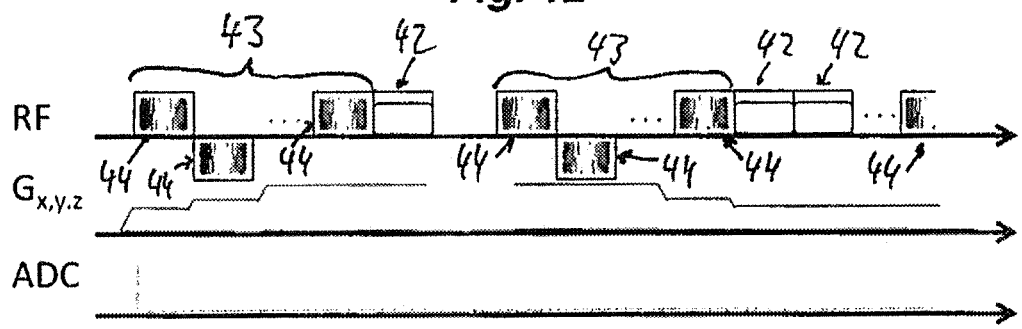
FIG. 12 shows a sequence diagram for an MR measurement in which the method depicted in FIG. 11 can be used.

FIG. 11 shows an alternative exemplary embodiment of an inventive method for the MR examination of a measurement object. This method can also be carried out using the RF unit 1 shown in FIG. 1. A sequence diagram for an MR measurement in which the method depicted in FIG. 11 can be used is depicted in FIG. 12. In contrast to the method depicted in FIG. 9, the method depicted in FIG. 11 involves the correction being separated from the actual measurement.

Thus, after an initialization 100, a checking step 106 is first of all added in step 106. This checking step 106 involves a checking signal 42 being radiated into the measurement object and measured. This may particularly be an on-resonant square-wave pulse. In step 104, a check is then performed to determine whether the signal strength of that section 42 of the measurement signal that is picked up in step 106 exceeds a previously stipulated limit value. If this is the case, the optimization step 105 is carried out and the checking step 106 is carried out again. This is effected until the limit value is no longer exceeded.

In an alternative exemplary embodiment, an abortion criterion can be defined, for example by prescribing a maximum number of passes of the loop 104, 105, 106 or of any other checking loop in order to avoid the method getting caught in the checking loop. When the checking loop is left, the measurement method would be continued, for example in step 101 in FIG. 11, using the values attained hitherto. Alternatively, the transmitted power can also be briefly reduced in order to restart the checking loop.

Since, in the exemplary embodiment depicted in FIG. 11, the limit value is no longer exceeded, the next measurement section 43 provided in order to reconstruct the desired information about the measurement object is then picked up in step 101 and a check is performed in step 102 to determine whether the measurement is intended to be completed. The measurement section 43 may be a short section comprising just one transmitted pulse 44, but also a section that comprises multiple transmitted pulses 44. If the measurement is intended to be completed, the measurement is terminated in step 103. Otherwise, the checking step 106 is carried out again.

For the method described here, but also generally for a method according to the invention, it may be appropriate not to choose step sizes that are constant over all iterations, but rather to adapt said step sizes. It is thus possible for adaptation to be effected as already described above on the basis of an extent to which the limit value is exceeded. However, it may also be expedient to progressively decrease the step sizes according to a prescribed scheme. This may be advantageous particularly if, during the optimization, first of all only the phase φ is adapted over multiple iteration steps and the amplitude A is not adapted until in a subsequent step. A mixture of the methods may also be expedient, for example if φ and A are adapted alternately, with one or more iterations being able to be chosen for the adaptation of φ and A in each case.

Figure 13:
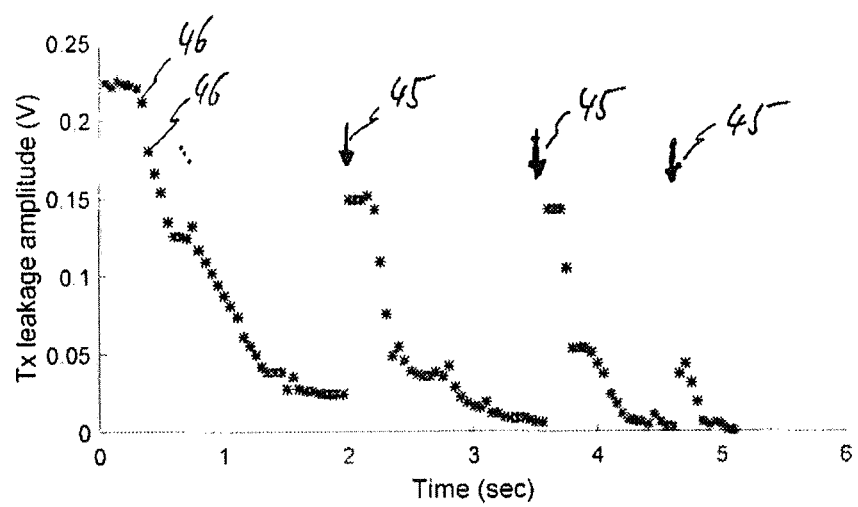
FIG. 13 shows a measurement graph that shows the convergence behavior of a correction method configured according to the invention when the examined measurement object is moved in an MRI scanner.

FIG. 13 plots the signal strength of a respective measurement section ("Tx leakage amplitude") over time ("Time"). The values on the y axis refer to volts, the values on the x axis to seconds. To generate the measurement data, only part of which, for the sake of clarity, is provided with the reference numeral 46, a method is used that is similar to the method depicted in FIG. 11 and FIG. 12. However, a low limit value has intentionally been chosen to check the effectiveness of the optimization method, which means that the method has not been able to break out of the loop 106, 104, 105. At each of the times indicated by an arrow 45, the subject examined made a hand movement. On account of the thereby changing coupling of the receiving coil 6 and the transmission coil 5, new optimum values had to be ascertained for each of φ and A. From FIG. 13, it can be seen that with a feedback time of 50 ms the optimization method used required between a few hundred milliseconds and a few seconds to converge, corresponding to a number from a few iterations to approximately 40 iterations. Alternatively, other feedback times can also be used, for example 5 ms.

FIG. 14 shows an alternative sequence diagram for an MR measurement of an MR examination according to the invention. In this case, a respective short checking signal 42 lasting a few microseconds is radiated into the measurement sequence at the end of each measurement section 43 and measured. In contrast to the method depicted in FIG. 11, there is no waiting here until convergence is achieved, but rather, in a similar manner to in the case of the method depicted in FIG. 9, a correction is applied continually and the measurement is applied without interruption. In contrast to the method depicted in FIG. 9, however, the measurement data picked up for reconstruction are not used for correcting the response signal, but rather checking pulses developed specifically for the correction are used. Since these pulses are very short, there continues to be an almost optimum acquisition efficiency.

In each of the exemplary embodiments described, the analog-to-digital converter 10 can remain switched on without interruption and can continually pick up measurement data (cf. FIGS. 10, 12 and 14, "ADC" row). This is advantageous, but not absolutely necessary for the invention. However, there are differences, as already described above, concerning whether and which of the measurement data are used by the optimization method and/or for reconstructing the desired information about the measurement object.

A method for the magnetic resonance examination of a measurement object is described, in which a measurement sequence is used in which the magnetic resonance response to the transmitted signal during transmission is measured. It is provided that a correction signal corresponding to the transmitted signal be generated and be used for correction of the response signal. To this end, the correction signal is modulated by a phase value and an amplitude value. The phase value and the amplitude value are automatically and iteratively customized for optimum correction of the response signal by an optimization method using a respective present state value of the measurement signal. Further, a radio-frequency unit 1 is described that can be used to carry out the method according to the invention.

LIST OF REFERENCE SYMBOLS

1 RF unit
2 RF generator
3 Signal amplifier
4 Signal divider
5 Transmission coil
6 Receiving coil
7 Signal combiner
8 Modulator
9 Further signal amplifier
10 Analog-to-digital converter
11 Computation unit
12 DC voltage power supply module
13 Phase modulator
14 Amplitude modulator
15 90° hybrid coupler
16 First connection of 15
17 Second connection of 15
18 Third connection of 15
19 Fourth connection of 15
20 Varactor diode
21 Further varactor diode
22 DC voltage source
23 Phase/voltage characteristic
24 Further phase/voltage characteristic
25 First connection of 14
26 Second connection of 14
27 DC voltage source
28 Further DC voltage source
29 Pin diode
30 Further pin diode
31 Further pin diode
32 Attenuation/voltage characteristic
33 Further attenuation/voltage characteristic
34 Hybrid coupler
35 Pin diode
36 Further pin diode
37 Resistor
38 Further resistor
39 First section of a measurement
40 Section of a measurement
41 Further section of a measurement
42 Checking signal
43 Measurement section
44 Transmitted pulse
45 Arrow
46 Measurement datum

The invention claimed is:

1. A method for the magnetic resonance examination of a measurement object, comprising:
radiating a transmitted signal into the measurement object,
picking up a response signal emitted by the measurement object in reaction to the transmitted signal, the response signal being at least intermittently picked up during a period of radiation of the transmitted signal,
generating a measurement signal by correction of the response signal and reconstructing a piece of information about the measurement object from the measurement signal,
generating a correction signal corresponding to the transmitted signal and using the correction signal for correction of the response signal and iteratively carrying out the following steps for correction of the response signal automatically:
ascertaining a present state value of the measurement signal, then ascertaining at least one of a present phase value or a present amplitude value for the correction signal using an optimization method, the optimization method using the present state value of the measurement signal as an input,
then modulating a present section of the correction signal that corresponds to a present section of the transmitted signal with the at least one of the present phase value or the present amplitude value,
then generating a present section of the measurement signal by subtraction of the present section of the correction signal from a present section of the response signal that is picked up at a same time as the present section of the transmitted signal is radiated, and
also using the respective present section of the measurement signal for reconstruction of the information about the measurement object.

2. The method as claimed in claim 1, wherein the present state value of the measurement signal is the measure of at least one of a transmitted signal component or a signal strength in the measurement signal.

3. The method as claimed in claim 1, wherein the optimization method further comprises using at least one further previously ascertained state value of the measurement signal as an input.

4. The method as claimed in claim 1, wherein the optimization method further comprises ascertaining at least one of the respective present phase value or amplitude value by a gradient method.

5. The method as claimed in claim 4, further comprising in each iteration, altering a variable on which at least one of the phase value or the amplitude value is dependent, reading a direction in which the variable has been altered in a previous iteration, choosing a step size for an alteration of the variable, comparing the present state value of the measurement signal with the present state value that was previously ascertained and altering the variable in the read direction in an event of an improvement in the present state value and altering the variable in a direction opposite to the read direction in an event of a worsening of the present state value.

6. The method as claimed in claim 1, further comprising picking up the response signal completely during a period of radiation of the transmitted signal.

7. The method as claimed in claim 1, wherein the information about the measurement object is reconstructed from the measurement signal by using at least 90% of a total pickup time of the response signal.

8. The method as claimed in claim 1, wherein the modulating of the present section of the correction signal that corresponds to the present section of the transmitted signal with at least one of the present phase value or the present amplitude value is effected in voltage-controlled fashion using at least one of a phase modulator (13), an amplitude modulator (14) adjustable in voltage-controlled fashion, or a digital voltage controller.

9. The method as claimed in claim 1, wherein the measurement signal is amplified using a signal amplifier (9), the signal amplifier (9) having a dynamic bandwidth that is outside a signal strength of an amplitude-modulated correction signal.

10. The method as claimed in claim 1, further comprising first checking the present state value of the measurement signal and, in the event of a first limit value being exceeded, carrying out the steps for correction of the response signal until the state value of the measurement signal has reached a second limit value.

11. The method of claim 10, wherein the second limit value is identical to the first limit value.

12. The method of claim 10, wherein at least one of the first or the second limit value is greater than an estimate of a maximum state value of the measurement signal.

13. The method as claimed in claim 1, wherein in the event of the present state value of the measurement signal exceeding a third limit value, generating a most recently generated section of the measurement signal again.

14. The method as claimed in claim 1, wherein an on-resonant pulse is radiated into the measurement object in order to generate the present section of the measurement signal.

15. A radio-frequency unit (1) of a magnetic resonance imaging scanner comprising:
a generator (2) for generating a radio-frequency signal,
a signal divider (4) that has a signal input operatively connected to an output of the generator (2) and that has a first output and a second output,
a transmission coil (5) that generates a transmitted signal and that is operatively connected to the first output of the signal divider (4),
a receiving coil (6) that picks up a response signal forming a magnetic resonance signal from a measurement object,
a modulator (8) that is operatively connected to the second output of the signal divider (4), the modulator (8) comprising a phase modulator (13) and/or an amplitude modulator (14),
a signal combiner (7) that is operatively connected to the receiving coil (6) and the modulator (8) that generates a measurement signal,
a control unit (11) operatively connected to the signal combiner (7) and the modulator (8), the control unit being configured such that the radio-frequency unit (1) carries out the method as claimed in claim 1.

* * * * *